US012615753B2

(12) United States Patent
Wu et al.

(10) Patent No.: US 12,615,753 B2
(45) Date of Patent: Apr. 28, 2026

(54) SEMICONDUCTOR STRUCTURE AND MANUFACTURING METHOD THEREOF

(71) Applicant: CHANGXIN MEMORY TECHNOLOGIES, INC., Hefei City (CN)

(72) Inventors: Runping Wu, Hefei City (CN); Daejoong Won, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 493 days.

(21) Appl. No.: 18/164,585

(22) Filed: Feb. 4, 2023

(65) Prior Publication Data

US 2023/0397388 A1 Dec. 7, 2023

(30) Foreign Application Priority Data

Jun. 2, 2022 (CN) .......................... 202210625081.9

(51) Int. Cl.
*H10B 12/00* (2023.01)

(52) U.S. Cl.
CPC .................................... *H10B 12/00* (2023.02)

(58) Field of Classification Search
CPC ....... G11C 8/14; G11C 11/4097; H10B 12/00; H10B 12/05; H10B 12/20; H10B 12/30
USPC .......................................................... 257/314
See application file for complete search history.

(56) References Cited

U.S. PATENT DOCUMENTS

| 2002/0145159 A1* | 10/2002 | Ishii | ................... | G11C 16/0433 |
| | | | | 257/E21.654 |
| 2017/0069841 A1* | 3/2017 | Ino | ........................ | H10D 30/701 |
| 2021/0082921 A1* | 3/2021 | Wada | ................... | H10B 12/036 |
| 2021/0151437 A1 | 5/2021 | Tomishima | | |

OTHER PUBLICATIONS

A. Belmonte, et,al. "Capacitor-less, Long-Retention (>400s) DRAM Cell Paving the Way towards Low-Power and High-Density Monolithic 3D DRAM", IEDM20-612), 2020 IEEE International Electron Devices Meeting (IEDM).

* cited by examiner

*Primary Examiner* — Fazli Erdem
(74) *Attorney, Agent, or Firm* — SYNCODA LLC; Feng Ma

(57) ABSTRACT

A semiconductor structure includes a substrate, first transistor columns and second transistor columns on the substrate. The first transistor columns and the second transistor columns are alternately arranged. A first transistor column includes a plurality of first transistors arranged in a first direction. A second transistor column includes a plurality of second transistors arranged in the first directions. The plurality of first transistors in the first transistor column are electrically connected to the plurality of second transistors in the second transistor column in one-to-one correspondence. A length direction of the first transistor is the same as a length direction of the second transistor. A center of the first transistor is offset from a center of the second transistor in the first direction.

13 Claims, 23 Drawing Sheets

WL1
WL2
V5
V6
BL2
L3
BL1
V4
16
V2
V1
d1
V3
g
c1
L2
c2
141
d2
11
151
L1
10 first direction
second direction

Figure 2:
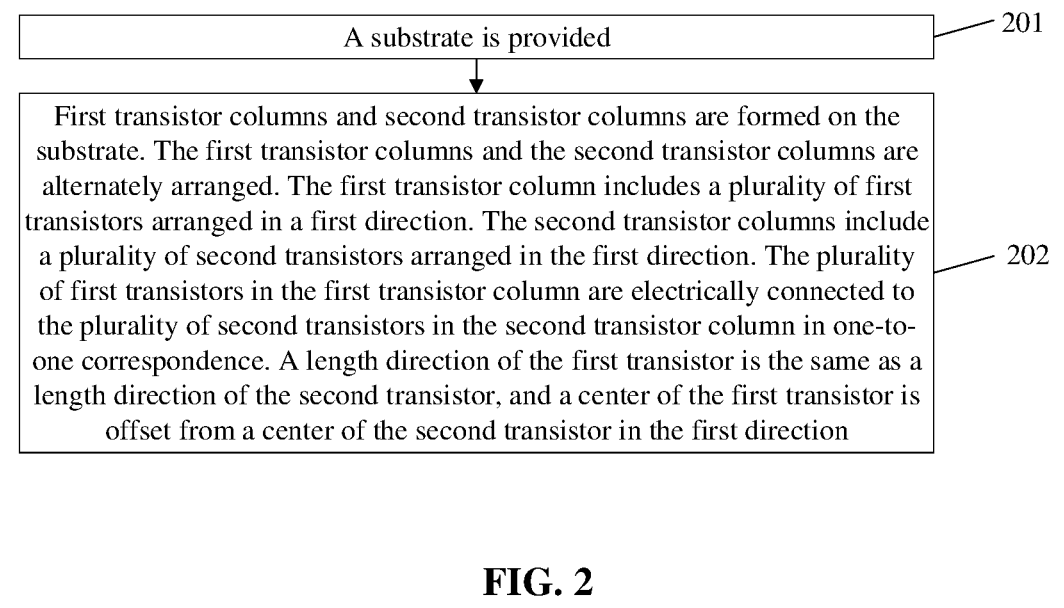

| A substrate is provided | — 201 |

First transistor columns and second transistor columns are formed on the substrate. The first transistor columns and the second transistor columns are alternately arranged. The first transistor column includes a plurality of first transistors arranged in a first direction. The second transistor columns include a plurality of second transistors arranged in the first direction. The plurality of first transistors in the first transistor column are electrically connected to the plurality of second transistors in the second transistor column in one-to-one correspondence. A length direction of the first transistor is the same as a length direction of the second transistor, and a center of the first transistor is offset from a center of the second transistor in the first direction — 202

FIG. 2 first direction second
direction

SEMICONDUCTOR STRUCTURE AND MANUFACTURING METHOD THEREOF

CROSS-REFERENCE TO RELATED APPLICATION

This application claims priority to Chinese Application No. 202210625081.9 filed on Jun. 2, 2022, the disclosure of which is hereby incorporated by reference in its entirety.

BACKGROUND

In a currently common dynamic random access memory, a memory cell usually consists of a transistor and a capacitor (1T1C), and the capacitor is used to store data. However, 1T1C DRAM has a high requirement for an amount of charge that a capacitor can store, and is destructive in reading of the capacitor, so rewriting will be needed after the reading operation, which increases the power consumption. Moreover, because of a complex manufacturing process and a high occupied volume of the capacitor, it becomes a problem to miniaturize dimension.

In two-transistor capacitor-less (2T0C) DRAM, a memory structure usually consists of a read transistor and a write transistor. However, in some implementations, the integration of 2T0C dynamic random access memory is low.

SUMMARY

The disclosure relates to the technical field of semiconductor manufacturing, and in particular to a semiconductor structure and a manufacturing method thereof.

Embodiments of the disclosure provides a semiconductor structure, including a substrate, and first transistor columns and second transistor columns on the substrate.

The first transistor columns and the second transistor columns are alternately arranged. A first transistor column includes a plurality of first transistors arranged in a first direction. A second transistor column includes a plurality of second transistors arranged in the first direction. The plurality of first transistors in the first transistor column are electrically connected to the plurality of second transistors in the second transistor column in one-to-one correspondence.

A length direction of a first transistor is the same as a length direction of a second transistor. A center of the first transistor is offset from a center of the second transistor in the first direction.

Embodiments of the disclosure also provide a manufacturing method of a semiconductor structure, including the following operations.

A substrate is provided.

First transistor columns and second transistor columns are formed on the substrate. The first transistor columns and the second transistor columns are alternately arranged. A first transistor column includes a plurality of first transistors arranged in a first direction. A second transistor columns includes a plurality of second transistors arranged in the first direction. The plurality of first transistors in the first transistor column are electrically connected to the plurality of second transistors in the second transistor column in one-to-one correspondence. A length direction of a first transistor is the same as a length direction of a second transistor, and a center of the first transistor is offset from a center of the second transistor in the first direction.

BRIEF DESCRIPTION OF THE DRAWINGS

To more clearly illustrate the technical solutions in the embodiments of the disclosure, the drawings needed to be used in the embodiments will be briefly described below. It will be apparent that the drawings in the following description are only some embodiments of the disclosure, from which other drawings can also be obtained without creative effort by a person of ordinary skill in the art.

FIG. 2 is a flowchart of a manufacturing method of a semiconductor structure provided by an embodiment of the disclosure.

DETAILED DESCRIPTION

Figure 1A:
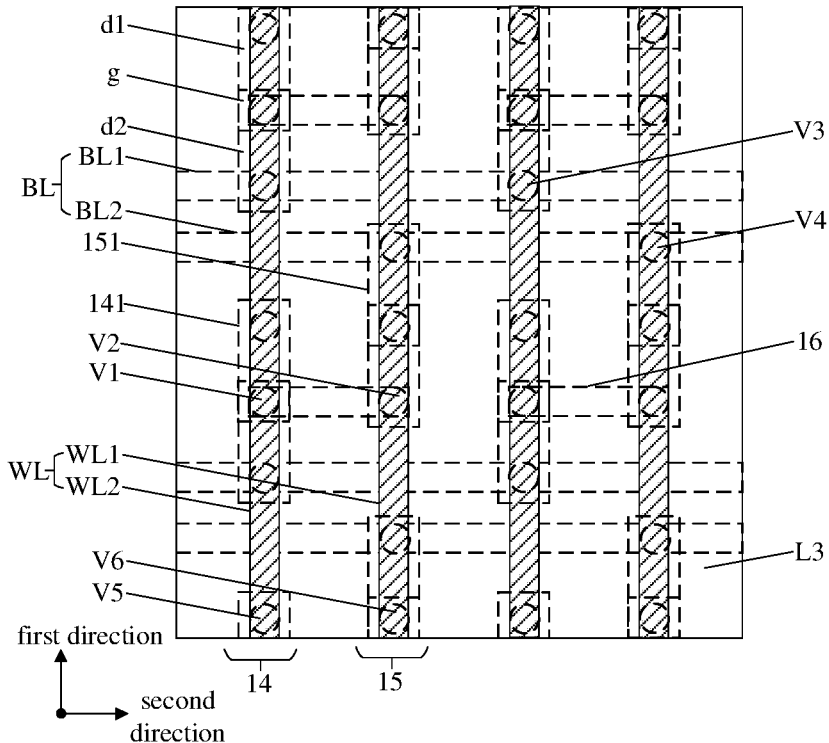
FIG. 1A is a schematic top view of a semiconductor structure provided by an embodiment of the disclosure.

Exemplary implementations of the disclosure will be described in more detail below with reference to the accompanying drawings. Although the exemplary implementations of the disclosure are shown in the accompanying drawings, it is to be understood that the disclosure may be implemented in various forms and should not be limited by the specific implementations set forth herein. On the contrary, these embodiments are provided to enable a more thorough understanding of the disclosure and to fully convey the scope of the disclosure to those skilled in the art.

In the following description, numerous specific details are given to provide a more thorough understanding of the disclosure. However, it will be apparent to those skilled in the art that the disclosure may be practiced without one or more of these details. In other examples, some technical features well known in the art are not described in order to avoid confusion with the disclosure, that is, not all features of the actual embodiments are described herein and well-known functions and structures are not described in detail.

In the figures, the dimensions of layers, regions, elements and their relative dimensions may be exaggerated for clarity. The same reference numerals denote the same elements throughout.

It should be understood that when an element or layer is referred to as being "on", "adjacent to", "connected to" or "coupled to" another element or layer, it may be directly on, adjacent to, connected to, or coupled to the other element or layer, or intervening elements or layers may exist. Conversely, when an element is referred to as being "directly on", "directly adjacent to", "directly connected to" or "directly coupled to" another element or layer, there is no intervening element or layer. It should be understood that, although the terms first, second, third, etc. may be used to describe various elements, components, regions, layers, and/or portions, the elements, components, regions, layers, and/or portions should not be limited by such terms. These terms are used only to distinguish one element, component, region, layer, or portion from another element, component, region, layer, or portion. Thus, a first element, component, region, layer, or portion discussed below may be represented as a second element, component, region, layer, or portion without departing from the teachings of the disclosure. The discussion of a second element, component, region, layer or portion does not imply that a first element, component, region, layer or portion is necessarily present in the disclosure.

Spatially relational terms such as "below", "under", "lower", "beneath", "above", and "upper" may be used herein for conveniently describing a relationship between one element or feature and another element or feature illustrated in the figures. It is to be understood that, in addition to the orientations shown in the figures, the spatially relational terms are intended to further include different orientations of devices in use and operation. For example, if the devices in the figures are turned over, elements or features described as being "under" or "beneath" or "below" other elements or features will be oriented to be "on" the other elements or features. Therefore, the exemplary terms "under" and "below" may include both orientations, above and below. Moreover, the device may be otherwise oriented (rotation by 90 degrees or in other orientations) and the spatial descriptors used herein may be interpreted accordingly.

The terminology used herein is intended to describe specific embodiments only and is not to be a limitation of the disclosure. As used herein, the singular forms "a", "an" and "said/the" are also intended to include the plural forms, unless the context clearly indicates otherwise. It should also be understood that the terms "consist . . . of" and/or "include", when used in this specification, determine the presence of the features, integers, steps, operations, elements and/or components, but do not exclude the presence or addition of one or more other features, integers, steps, operations, elements, components and/or groups. As used herein, the term "and/or" includes any and all combinations of related listed items.

In a currently common dynamic random access memory, a memory cell usually consists of one transistor and one capacitor (1T1C), and the capacitor is used to store data. However, 1T1C DRAM has a high requirement for an amount of charge that a capacitor can store, and is destructive in reading of the capacitor, so rewriting will be needed after the reading operation, which increases the power consumption. Moreover, because of a complex manufacturing process and a high occupied volume of the capacitor, it becomes a problem to miniaturize dimension.

In two-transistor capacitor-less (2T0C) DRAM, a memory structure usually consists of a read transistor and a write transistor. However, in some implementations, a length direction of the read transistor is perpendicular to a length direction of the write transistor, which makes an arrangement density of the read transistor and the write transistor low, thus reducing an integration of the 2T0C dynamic random access memory.

Based on this, the following technical solution of the embodiments of the present disclosure is proposed. The specific implementations of the disclosure will be described in detail below in combination with the accompany drawings. In detailing the embodiments of the disclosure, for the sake of illustration, schematic diagrams will be partially enlarged not in accordance with the normal scale. The schematic diagrams are only exemplary, and should not limit the scope of protection of the disclosure here.

Figure 1B:
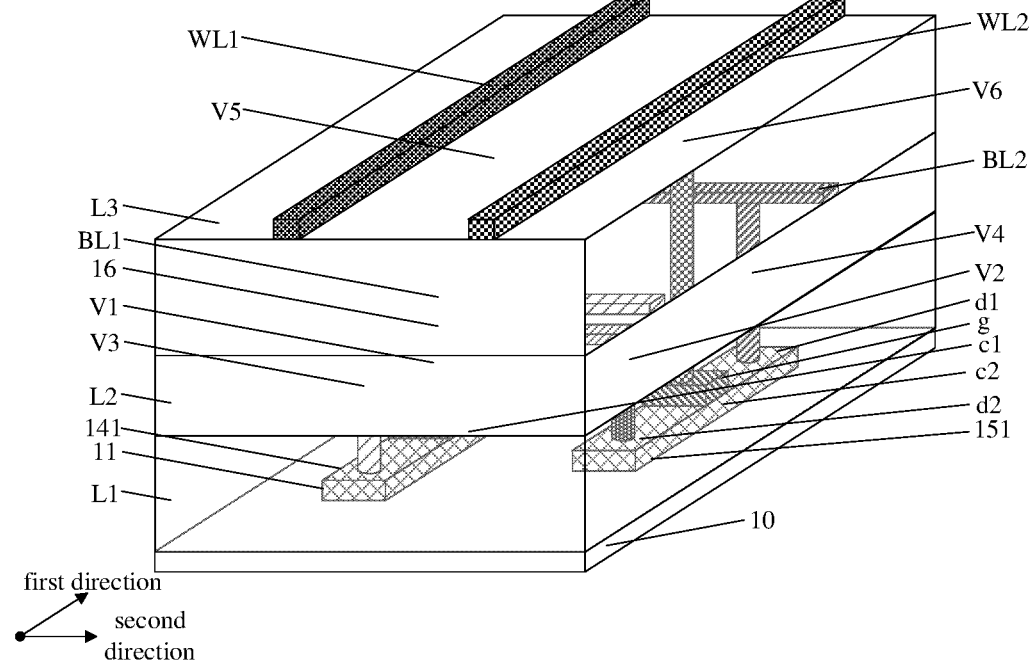
FIG. 1B is a partial perspective view of FIG. 1A.

FIG. 1A is a schematic top view of a semiconductor structure provided by an embodiment of the disclosure, and FIG. 1B is a partial perspective view of FIG. 1A. The semiconductor structure provided by the embodiments of the disclosure will be described further below with reference to FIGS. 1A and 1B.

As shown in FIGS. 1A and 1, the semiconductor structure includes: a substrate 11, first transistor columns 14 and second transistor columns 15 on substrate 11. The first transistor columns 14 and the second transistor columns 15 are alternately arranged. Each of the first transistor columns 14 includes a plurality of first transistors 141 arranged in a first direction. Each of the second transistor columns 15 includes a plurality of second transistors 151 arranged in the first direction. The plurality of first transistors 141 in the first transistor column 14 are electrically connected to the plurality of second transistors 151 in the second transistor column 15 in one-to-one correspondence. A length direction of the first transistor 141 is the same as a length of the second transistor 151. A center of the first transistor 141 is offset from a center of the second transistor 151 in the first direction.

As shown in FIG. 1A, the center of the first transistor 141 is offset from the center of the second transistor 151 in the first direction, which means that a direction of a line connecting the center of the first transistor 141 and the center of the second transistor 151 intersects with the first direction and is not perpendicular to the first direction.

In practice, the semiconductor structure provided by embodiments of the disclosure may be, but is not limited to, a two-transistor capacitor-less (2T0C) three-dimensional dynamic random access memory, and the semiconductor structure may also be any semiconductor structure having a read transistor and a write transistor.

As shown in FIG. 1B, in an embodiment, the semiconductor structure further includes a base 10. The substrate 11 is formed on the base 10. In some embodiments, the substrate 11 and the base 10 may be separated by an insulating layer (not shown).

The base 10 may be a semiconductor base and may include at least one elemental semiconductor material (such as a silicon (Si) substrate, a germanium (Ge) substrate), at least one III-V compound semiconductor material, at least one II-VI compound semiconductor material, at least one organic semiconductor material, or other semiconductor materials known in the art. In a specific embodiment, the base is a silicon base, which may be doped or undoped.

In some embodiments, a material of the substrate 11 may include an elemental semiconductor material (such as a silicon (Si) substrate, a germanium (Ge) substrate), at least one III-V compound semiconductor material, at least one II-VI compound semiconductor material, at least one organic semiconductor material, or other semiconductor materials known in the art.

In some embodiments, a material of the substrate 11 includes $In_XGa_YZn_ZO$, in which x, y, and z are positive integers greater than or equal to 1. But not limited thereto, the material of the substrate 11 may also include at least one of indium oxide, tin oxide, gallium oxide, In—Sn oxide, In—W oxide, In—Zn oxide, Sn—Zn oxide, Al—Zn oxide, In—Ga oxide, In—Al—Zn oxide, In—Sn—Zn oxide, Sn—Ga—Zn oxide, Al—Ga—Zn oxide, or Sn—Al—Zn oxide.

But not limited thereto, the material of the substrate 11 may also include at least one of In—Hf—Zn oxide, In—La—Zn oxide, In—Ce—Zn oxide, In—Pr—Zn oxide, In—Nd—Zn oxide, In—Sm—Zn oxide, In—Eu—Zn oxide, In—Gd—Zn oxide, In—Tb—Zn oxide, In—Dy—Zn oxide, In—Ho—Zn oxide, In—Er—Zn oxide, In—Tm—Zn oxide, In—Yb—Zn oxide, In—Lu—Zn oxide; or quaternary metal oxide such as In—Sn—Ga—Zn oxide, In—Hf—Ga—Zn oxide, In—Al—Ga—Zn oxide, In—Sn—Al—Zn oxide, and In—Sn—Hf—Zn oxide, In—Hf—Al—Zn oxide.

In embodiments of the disclosure, an oxide semiconductor material is used as the material of the substrate 11. Since the oxide semiconductor material has a higher carrier mobility and a lower leakage current, the leakage current of the first transistor 141 and the second transistor 151 can be effectively reduced, and an on-off current ratio and a current drivability of the first transistor and the second transistor can be effectively improved. Thus, an access speed of the semiconductor structure is increased, and the power consumption is reduced.

In some embodiments, the first transistor 141 includes a gate g and a first electrode d1 and second electrode d2 located on either side of the gate g. The second transistor 151 includes a gate g and a first electrode d1 and a second electrode d2 located on either side of the gate g. The first electrode d1 and the second electrode d2 each is one of a source or a drain, and they are different. A direction from the first electrode d1 of the first transistor 141 to the second electrode d2 of the first transistor 141 is the same as a direction from the first electrode d1 of the second transistor 151 to the second electrode d2 of the second transistor 151. That is, a direction from a source to a drain of the first transistor 141 is the same as a direction from a source to a drain of the second transistor 151.

In some embodiments, the first transistor 141 further includes a first channel c1 below the gate g of the first transistor 141. The second transistor 151 further includes a second channel c2 below the gate g of the second transistor 151. A doping type of the first electrodes d1 and a doping type of the second electrode d2 may be same. The doping type of the first electrode d1 and the second electrodes d2 may be different from a doping type of the first channel c1 and the second channel c2. For example, the first electrode d1 and the second electrode d2 are of P-type doping, and the first channel c1 and the second channel c2 is of N-type doping. Alternatively, the first electrode d1 and the second electrode d2 are of N-type doping, and the first channel c1 and the second channel c2 is of P-type doping.

In some embodiments, the first transistor 141 further includes a gate dielectric layer (not shown) sandwiched between the gate g and the first channel c1 of the first transistor 141. The second transistor 151 further includes a gate dielectric layer (not shown) sandwiched between the gate g and the second channel c2 of the second transistor 141. A material of the gates g includes one or more of tungsten (W), copper (Cu), titanium (Ti), tantalum (Ta), titanium nitride (TiN), tantalum nitride (TaN), a metal silicide, or a metal alloy. A material of the gate dielectric layers (not shown) may be a material with a high dielectric constant, such as tantalum oxide, hafnium oxide, zirconium oxide, niobium oxide, titanium oxide, barium oxide, strontium oxide, yttrium oxide, lanthanum oxide, praseodymium oxide, strontium barium titanate, etc.

In some embodiments, the first transistors 141 include read transistors, and the second transistors 151 include write transistors. One first transistor 141 and one second transistor 151 corresponding thereto constitute a memory cell. In the embodiment of the disclosure, the length directions of the first transistor 141 and the second transistor 151 are the same, so that the first transistor 141 and the second transistor 151 can be arranged more closely, and thus the integration of the semiconductor structure is improved. In addition, there is no need to manufacture a capacitor additionally, so the process is simple. Moreover, no rewriting operation is needed after reading, thereby reducing power consumption.

In some embodiments, the length directions of the first transistor 141 and the second transistor 151 are the first direction. A length direction of a transistor refers to a length direction of a channel region of the transistor. In this way, a maximum transistor arrangement density is allowed be obtained compared to other length directions. But not limited thereto, in other embodiments, the length directions of the first transistor 141 and the second transistor 151 may also be oblique to the first direction.

In some embodiments, the first transistor columns 14 and the second transistor columns 15 are alternately arranged in a second direction perpendicular to the first direction. In the second direction, the projection of the first transistor 141 overlaps with the projection of the second transistor 151. But not limited thereto, the second direction may also be oblique to the first direction. By arranging the first transistor 141 and the second transistor 151 such that their projections in the second direction overlap, the arrangement density of the transistors can be further increased. In a specific embodiment, in the second direction, the projection of a first electrode d1 of the first transistor 141 overlaps with the projection of the gate g of the second transistor 151, and the projection of the gate g of the first transistor 141 overlaps with the projection of the second electrode d2 of the second transistor 151, thereby allowing for a maximum arrangement density compared to other arrangements. In a more specific embodiment, in the second direction, there is at least a region where the projection of the second electrode d2 of the first transistor 141 does not overlap with the projection of the first electrode d1 of the second transistor 151.

As shown in FIG. 1A, in some embodiments, the number of the first transistor column 14 and the second transistor column 15 are both plural. The plurality of first transistor columns 14 and the plurality of second transistor columns 15 are alternately arranged in the second direction. In some embodiments, in the second direction, the intervals between any first transistor 141 and second transistor 151 that are adjacent are the same, so that the arrangement density of the transistors can be further improved.

In some embodiments, the semiconductor structure further includes a plurality of bit lines BL above the substrate 11 and extending in the second direction and a plurality of word lines WL above the bit lines BL and extending in the first direction. The bit line BL is connected to the second electrode d2 of the first transistor 141 or the first electrode d1 of the second transistor 151. The word line WL is connected to the first electrode d1 of the first transistor 141 or the gate g of the second transistor 151.

Specifically, the plurality of bit lines BL include a first bit line BL1 and a second bit line BL2 alternately arranged in the first direction. The first bit line BL1 is electrically connected to the second electrode d2 of the first transistor 141. The second bit line BL2 is electrically connected to the first electrode d1 of the second transistor 151.

The plurality of word lines WL include a first word line WL1 and a second word line WL2 alternately arranged in the second direction. The first word line WL1 is electrically connected to the first electrode d1 of the first transistor 141. The second word line WL2 is electrically connected to the gate g of the second transistor 151.

More specifically, the first bit line BL1 is electrically connected to the second electrode d2 of the first transistor 141 through a third contact plug V3. The second bit line BL2 is electrically connected to the first electrode d1 of the second transistor 151 through a fourth contact plug V4. The first word line WL1 is electrically connected to the first electrode d1 of the first transistor 141 through a fifth contact plug V5. The second word line WL2 is electrically connected to the gate g of the second transistor 151 through a sixth contact plug V6.

In some embodiments, the number of the first bit line BL1 and the number of the second bit line BL2 are both plural. The plurality of first bit lines BL1 and the plurality of second bit lines BL2 are alternately arranged in the first direction. The number of the first word line WL1 and the number of the second word line WL2 are both plural. The plurality of first word lines WL1 and the plurality of second word lines WL2 are alternately arranged in the second direction. In some embodiments, the plurality of first word lines WL1 and the plurality of second word lines WL2 are arranged at equal intervals in the second direction.

In embodiments of the disclosure, by arranging a direction form the first electrode d1 of the first transistor 141 to the second electrode d2 of the first transistor 141 to be the same as a direction from the first electrode d1 of the second transistor 151 to the second electrode d2 of the second transistor 151, distances between the word lines WL, the bit lines BL, a third contact plug V3 and a fourth contact plugs V4 can be widened to obtain a better arrangement, thereby better avoiding problems such as a short circuit caused by mutual contact of the word lines WL, the bit lines BL, the third contact plug V3 and the fourth contact plug V4.

In embodiments of the disclosure, the word lines WL are arranged above the bit lines BL, the bit lines BL are arranged to extend in the second direction, and the word lines WL are arranged to extend in the first direction, instead of arranging the bit lines BL above the word lines WL or the bit lines BL to extend in the first direction and the word lines WL to extend in the second direction. Therefore, the word lines WL, the bit lines BL can be better prevented from mutual contacting with the third contact plug V3, the fourth contact plug V4, and a larger arrangement space can be obtained for the word lines WL and the bit lines BL.

It is to be understood that by arranging at least a region where the projection of the second electrode d2 of the first transistor 141 in the second direction does not overlap with the projection of the first electrode d1 of the second transistor 151 in the second direction, the first bit line BL1, the second bit line BL2, the third contact plug V3, and the fourth contact plug V4 can be better prevented from contacting each other.

In some embodiments, the semiconductor structure further includes at least one interconnect line 16 above the substrate 11. Each interconnect line 16 electrically connects the gate g of the first transistor 141 with the second electrode d2 of the corresponding second transistor 151. The word lines WL are located above the interconnect line 16. In a specific embodiment, the Interconnect Line 16 is electrically connected to the gate g of the first transistor through a first contact plug V1, and the interconnect Line 16 is electrically connected to the second electrode d2 of the second transistor through a second contact plug V2. In embodiments of the disclosure, by arranging the interconnect line 16 below the word lines WL, a problem such as short circuit caused by mutual contact of the word lines WL with the first contact plug V1, the second contact plug V2 is avoided.

As shown in FIG. 1B, in some embodiments, the semiconductor structure further includes a first filling layer L1, a second filling layer L2 and third filling layer L3.

The first filling layer L1 fills gaps between the first transistors 141 and the second transistors 151, and covers the first transistors 141 and the second transistors 151. The first contact plug V1 and the second contact plug V2 penetrate the first filling layer L1, and the interconnection line 16 is located on the first filling layer L1.

The second filling layer L2 covers the first filling layer L1 and the interconnection line 16. The third contact plug V3 and the fourth contact plug V4 penetrate the second filling layer L2 and the first filling layer L1. The bit lines BL are located on the second filling layer L2.

The third filling layer L3 covers the second filling layer L2 and the bit lines BL. The fifth contact plug V5 and the sixth contact plug V6 penetrate through the third filling layer L3, the second filling layer L2 and the first filling layer L1. The word lines WL are located on the third filling layer L3.

Materials of the word lines WL, the bit lines BL, the interconnect line 16, the first contact plug V1, the second contact plug V2, the third contact plug V3, the fourth contact plug V4, the fifth contact plug V5, and the sixth contact plug V6 include one or more of tungsten (W), copper (Cu), titanium (Ti), tantalum (Ta), titanium nitride (TiN), tantalum nitride (TaN), a metal silicide, or a metal alloy. Materials of the first fill layer L1, the second fill layer L2, and the third fill layer L3 include one or more of an oxide (such as silicon oxide), a nitride (such as silicon nitride), or an oxynitride (such as silicon oxynitride).

Embodiments of the disclosure also provide a manufacturing method of a semiconductor structure, as shown in FIG. 2, the method includes the following operations.

In S201, a substrate is provided.

In S202, first transistor columns and second transistor columns are formed on the substrate. The first transistor columns and the second transistor columns are alternately arranged. The first transistor column includes a plurality of first transistors arranged in a first direction. The second transistor column includes a plurality of second transistors arranged in the first direction. The plurality of first transistors in the first transistor column are electrically connected to the plurality of second transistors in the second transistor column in one-to-one correspondence. A length direction of the first transistors is the same as a length direction of the second transistors, and a center of the first transistor is offset from a center of the second transistor in the first direction.

The manufacturing method of the semiconductor structure of the embodiments of the disclosure is described in further detail below with reference to FIGS. 3A to 12B. FIG. 3A, FIG. 4A, FIG. 5A, FIG. 6A, FIG. 7A, FIG. 8A, FIG. 9A, FIG. 10A, FIG. 11A and FIG. 12A are schematic top views in different process operations of the manufacturing method of the semiconductor structure provided by the embodiments of the disclosure. FIG. 3B, FIG. 4B, FIG. 5B, FIG. 6B, FIG. 7B, FIG. 8B, FIG. 9B, FIG. 10B, FIG. 11B and FIG. 12B are partial perspective views of FIG. 3A, FIG. 4A, FIG. 5A, FIG. 6A, FIG. 7A, FIG. 8A, FIG. 9A, FIG. 11A and FIG. 12A respectively.

Figure 3A:
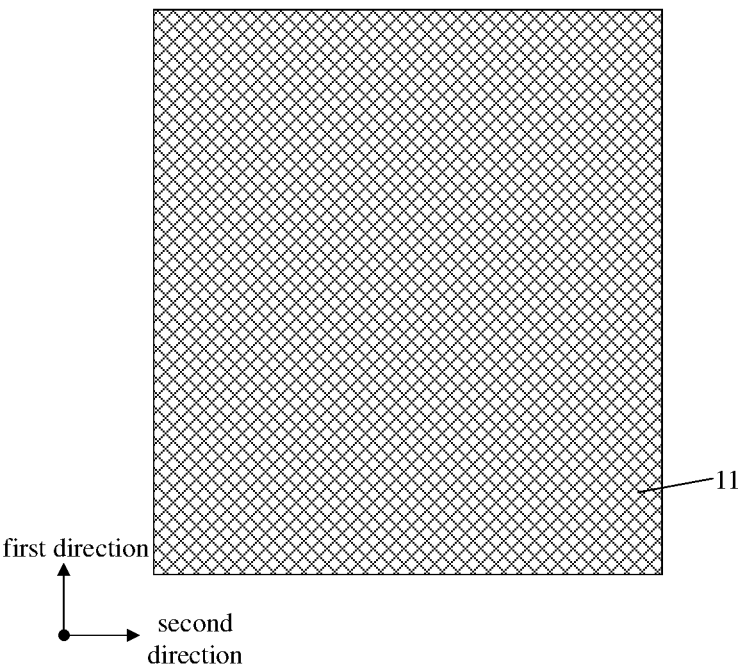
FIG. 3A is a first process flow diagram of a semiconductor structure provided by an embodiment of the disclosure.
Figure 3B:
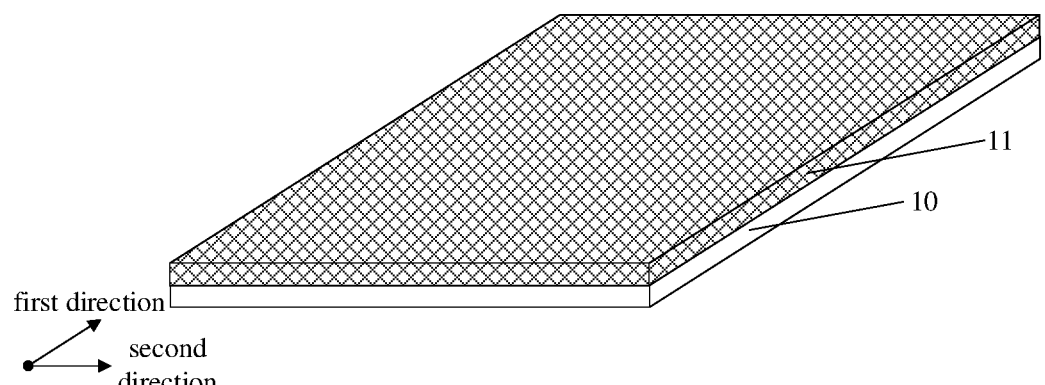
FIG. 3B is a second process flow diagram of a semiconductor structure provided by an embodiment of the disclosure.
Figure 4A:
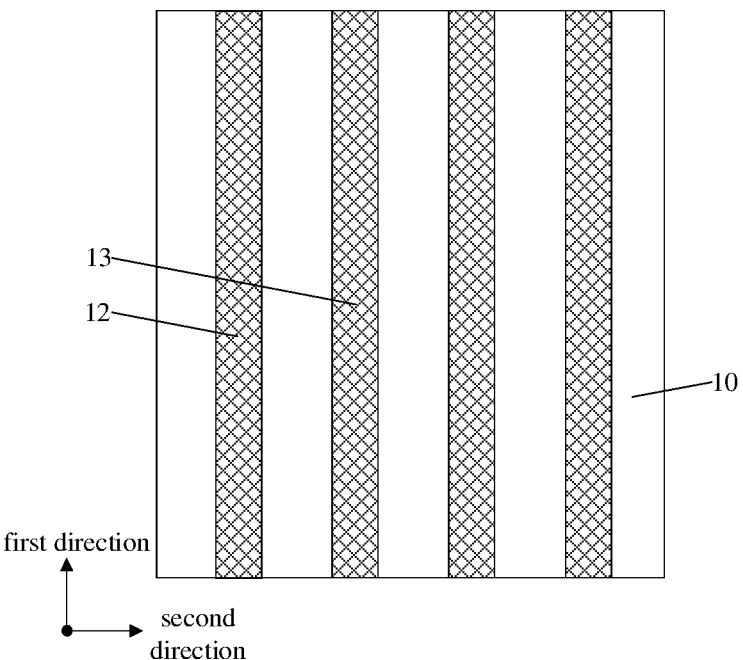
FIG. 4A is a third process flow diagram of a semiconductor structure provided by an embodiment of the disclosure.
Figure 4B:
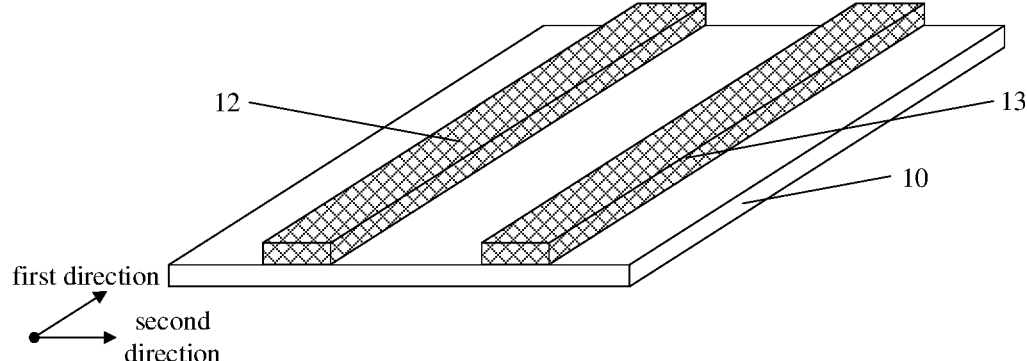
FIG. 4B is a fourth process flow diagram of a semiconductor structure provided by an embodiment of the disclosure.
Figure 5A:
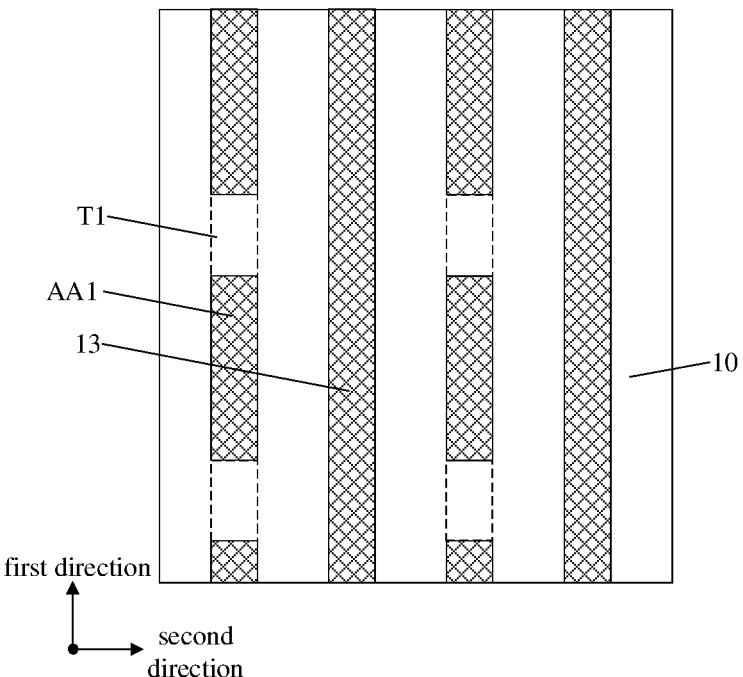
FIG. 5A is a fifth process flow diagram of a semiconductor structure provided by an embodiment of the disclosure.
Figure 5B:
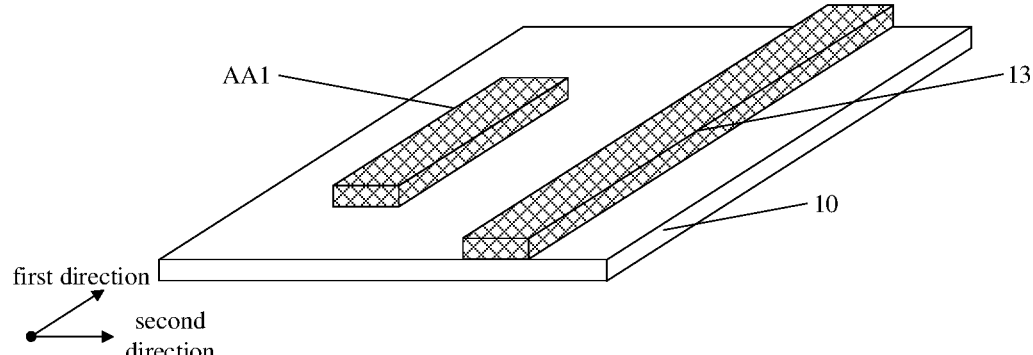
FIG. 5B is a sixth process flow diagram of a semiconductor structure provided by an embodiment of the disclosure.

Firstly, S201 is performed to provide a substrate 11, as shown in FIGS. 3A to 3B.

In some embodiments, a material of the substrate 11 includes $In_xGa_yZn_zO$, in which x, y, and z are positive integers greater than or equal to 1. But not limited thereto, the material of the substrate 11 may also include at least one of indium oxide, tin oxide, gallium oxide, In—Sn oxide, In—W oxide, In—Zn oxide, Sn—Zn oxide, Al—Zn oxide, In—Ga oxide, In—Al—Zn oxide, In—Sn—Zn oxide, Sn—Ga—Zn oxide, Al—Ga—Zn oxide, or Sn—Al—Zn oxide.

But not limited thereto, the material of the substrate 11 may also include at least one of In—Hf—Zn oxide, In—La—Zn oxide, In—Ce—Zn oxide, In—Pr—Zn oxide, In—Nd—Zn oxide, In—Sm—Zn oxide, In—Eu—Zn oxide, In—Gd—Zn oxide, In—Tb—Zn oxide, In—Dy—Zn oxide, In—Ho—Zn oxide, In—Er—Zn oxide, In—Tm—Zn oxide, In—Yb—Zn oxide, In—Lu—Zn oxide; and quaternary metal oxide such as In—Sn—Ga—Zn oxide, In—Hf—Ga—Zn oxide, In—Al—Ga—Zn oxide, In—Sn—Al—Zn oxide, In—Sn—Hf—Zn oxide, In—Hf—Al—Zn oxide.

Referring to FIG. 1B again, in some embodiments, the method further includes, before providing the substrate 11, providing a base 10. The substrate 11 is formed on the base 10. In some embodiments, the substrate 11 and the base 10 may be separated by an insulating layer (not shown).

The base 10 may be a semiconductor base and may include at least one elemental semiconductor material (such as a silicon (Si) substrate, a germanium (Ge) substrate), at least one III-V compound semiconductor material, at least one II-VI compound semiconductor material, at least one organic semiconductor material, or other semiconductor materials known in the art. In a specific embodiment, the base is a silicon base, which may doped or undoped.

Next, S202 is performed to form first transistor columns 14 and second transistor columns 15 on substrate 11, as shown in FIGS. 4A to 7B. The first transistor columns 14 and the second transistor columns 15 are alternately arranged. The first transistor column 14 includes a plurality of first transistors 141 arranged in a first direction. The second transistor columns 15 includes a plurality of second transistors 151 arranged in the first direction. The plurality of first transistors 141 in the first transistor column 14 are electrically connected to the plurality of second transistors 151 in the second transistor column 15 in one-to-one correspondence. A length direction of the first transistors 141 is the same as a length direction of the second transistors 151. A center of the first transistor 141 is offset from a center of the second transistor 151 in the first direction.

Specifically, firstly, as shown in FIGS. 4A to 6B, forming first transistor columns 14 and second transistor columns 15 on the substrate 11 includes the following operations.

A first wall-like structure 12 extending in the first direction and a second wall-like structure 13 extending in the first direction are formed by etching the substrate 11. The first wall-like structure 12 and the second wall-like structure 13 are alternately arranged in a second direction.

A plurality of first openings T1 are formed in the first wall-like structure 12 by etching the first wall-like structure 12. The plurality of first openings T1 disconnect the first wall-like structure 12 into a plurality of first active areas AA1.

A plurality of second openings T2 are formed in the second wall-like structure 13 by etching the second wall-like structure 13. The plurality of second openings T2 disconnect the second wall-like structure 13 into a plurality of second active areas AA2. A center of a second opening T2 is offset from a center of a first opening T1 in the first direction. A center of a first active area AA1 is offset from a center of a second active area AA2 in the first direction.

In some embodiments, the number of the first wall-like structure 12 and the number of the second wall-like structure 13 both are plural. The plurality of first wall-like structures 12 and the plurality of second wall-like structures 13 are alternately arranged. A self-aligned double patterning process (SADP) or a self-aligned quadruple patterning process (SAQP) may be used to etch the substrate 11 to form the first wall-like structures 12 and the second wall-like structures 13 simultaneously. Therefore, the process is simplified. Moreover, the first wall-like structures 12 and the second wall-like structures 13 can be allowed to be arranged at equal intervals of a desired value, thereby allowing a maximum arrangement density of the active areas to be obtained.

Figure 6A:
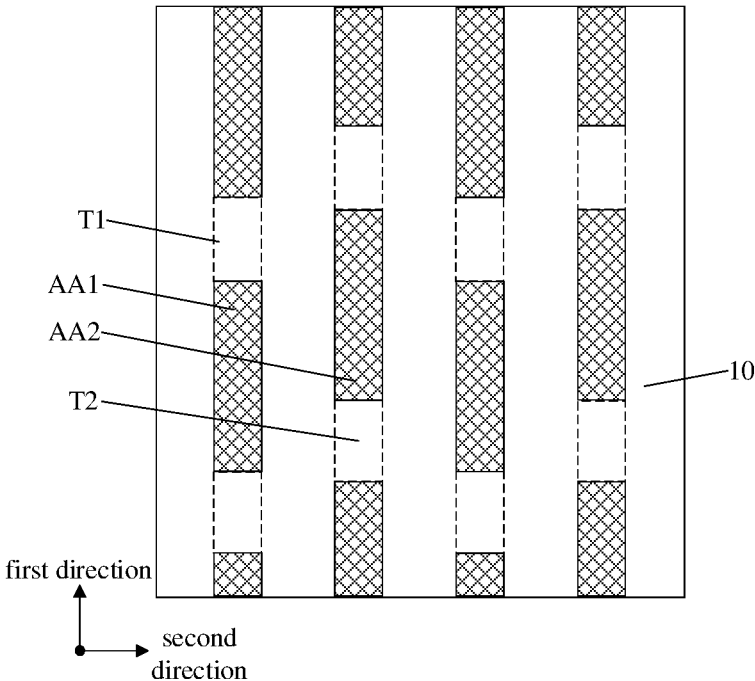
FIG. 6A is a seventh process flow diagram of a semiconductor structure provided by an embodiment of the disclosure.
Figure 6B:
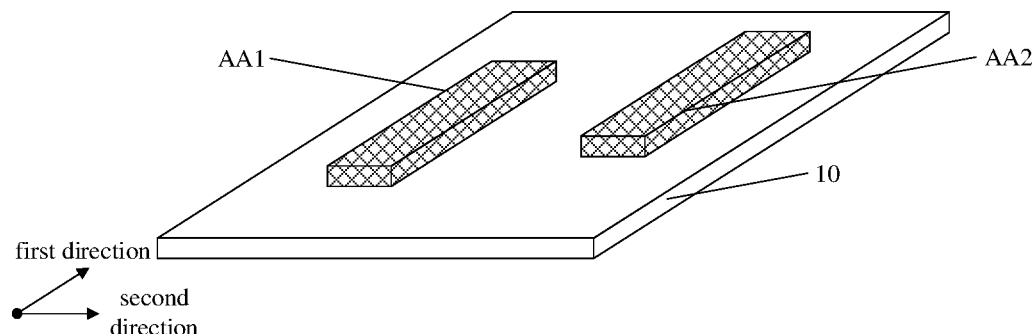
FIG. 6B is an eighth process flow diagram of a semiconductor structure provided by an embodiment of the disclosure.

As shown in FIG. 6A, the plurality of first openings T1 disconnect the first wall-like structure 12 into the plurality of first active areas AA1 with a length direction being the first direction, and the plurality of second openings T2 disconnect the second wall-like structure 13 into the plurality of second active areas AA2 with a length direction being the first length direction, thus allowing a maximum arrangement density of active areas to be obtained compared to other length directions. But not limited thereto, the length directions of the first active areas AA1 and the second active areas AA2 may also be oblique to the first direction. The center of the first active area AA1 is offset from the center of the second active area AA2 in the first direction, which means that a direction of a line connecting the center of the first active area AA1 and the center of the second active area AA2 intersects with and is not perpendicular to the first direction.

In the above embodiments, the first openings T1 are formed, and then the second openings T2 are formed. But not limited thereto, in other embodiments, the first openings T1 and the second openings T2 may also be formed simultaneously, thus simplifying the process.

Figure 7A:
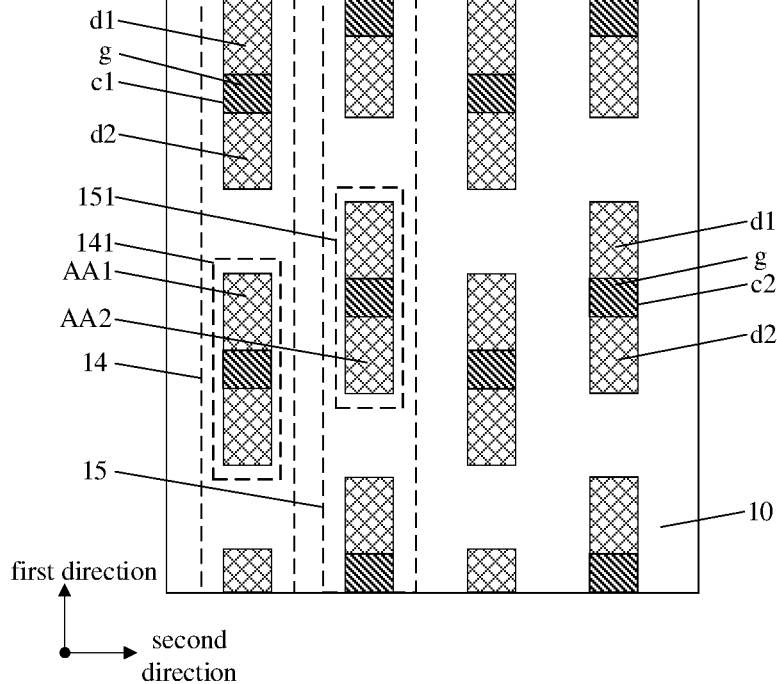
FIG. 7A is a ninth process flow diagram of a semiconductor structure provided by an embodiment of the disclosure.
Figure 7B:
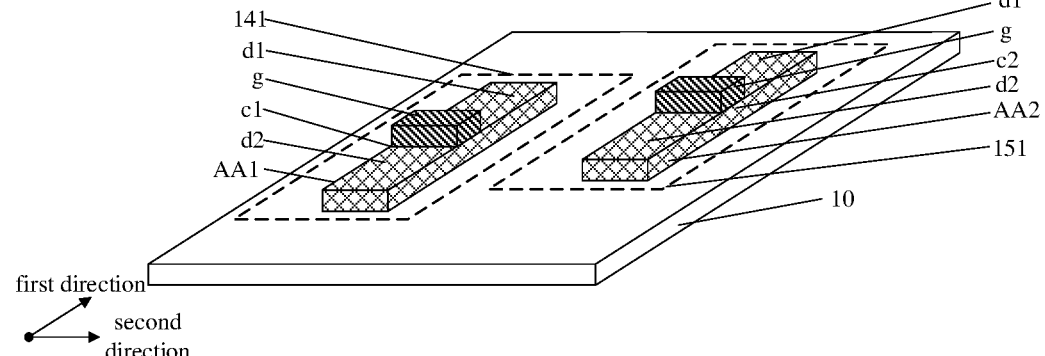
FIG. 7B is a tenth process flow diagram of a semiconductor structure provided by an embodiment of the disclosure.
Figure 8A:
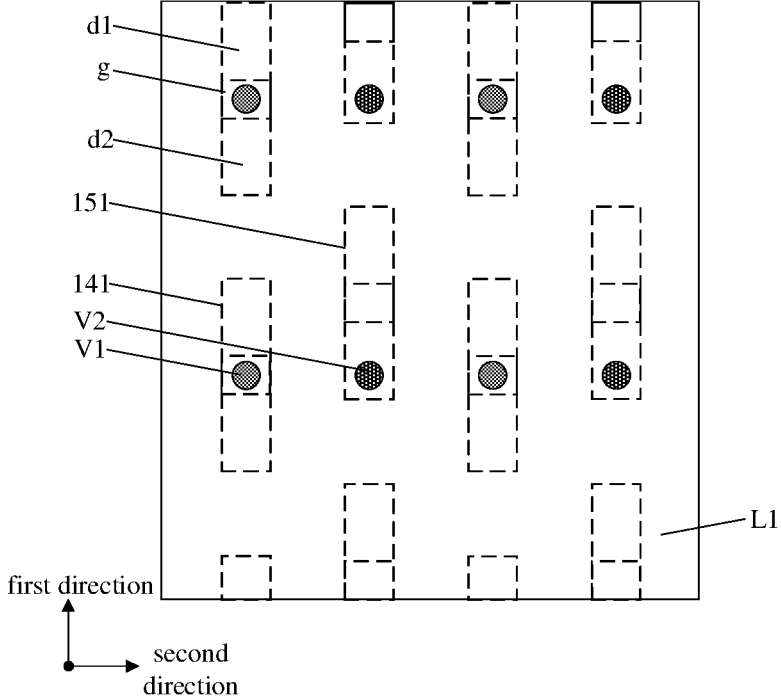
FIG. 8A is an eleventh process flow diagram of a semiconductor structure provided by an embodiment of the disclosure.
Figure 8B:
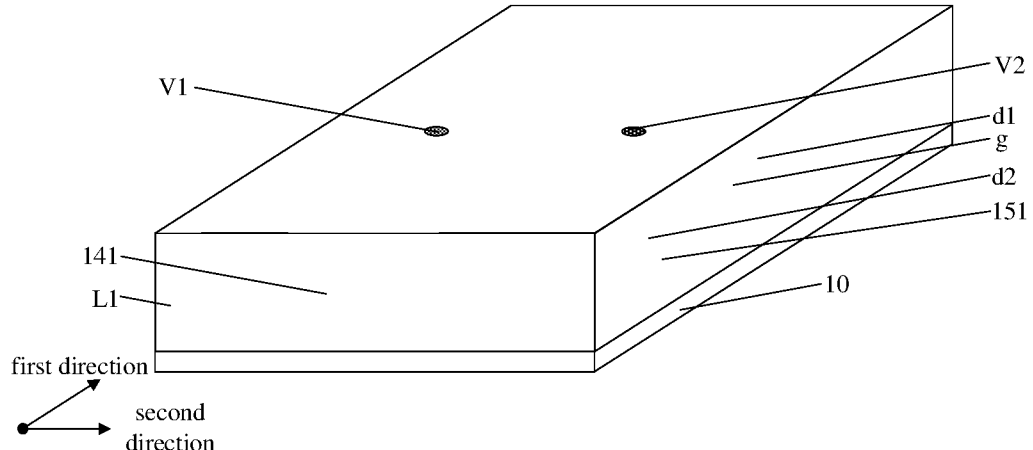
FIG. 8B is a twelfth process flow diagram of a semiconductor structure provided by an embodiment of the disclosure.
Figure 9A:
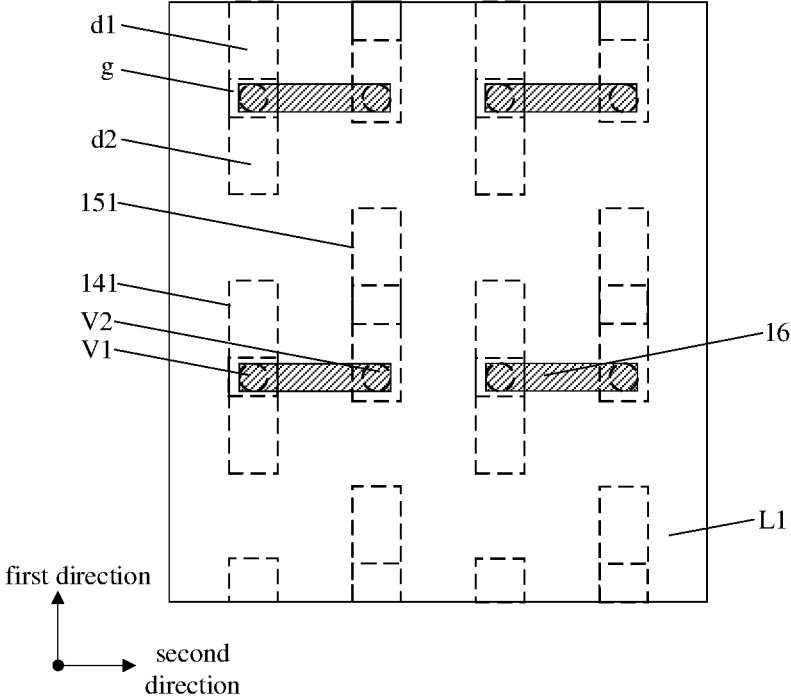
FIG. 9A is a thirteenth process flow diagram of a semiconductor structure provided by an embodiment of the disclosure.
Figure 9B:
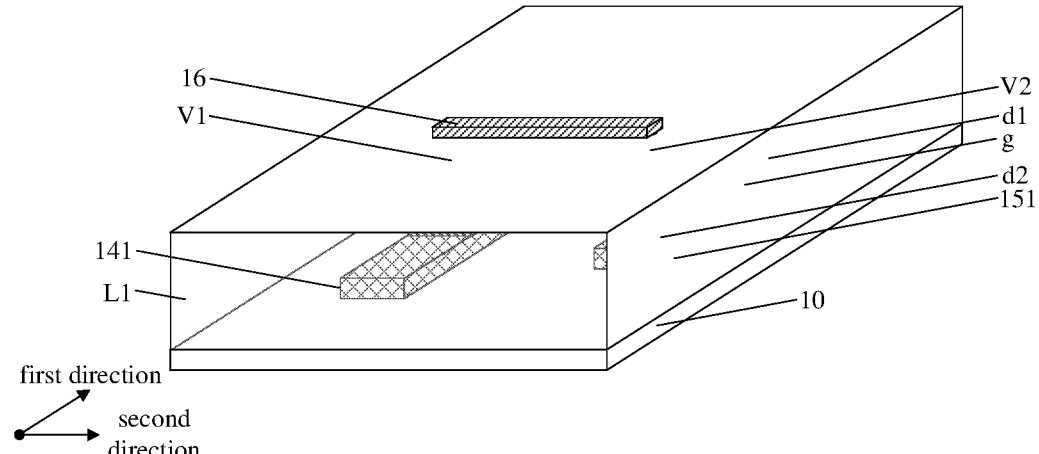
FIG. 9B is a fourteenth process flow diagram of a semiconductor structure provided by an embodiment of the disclosure.
Figure 10A:
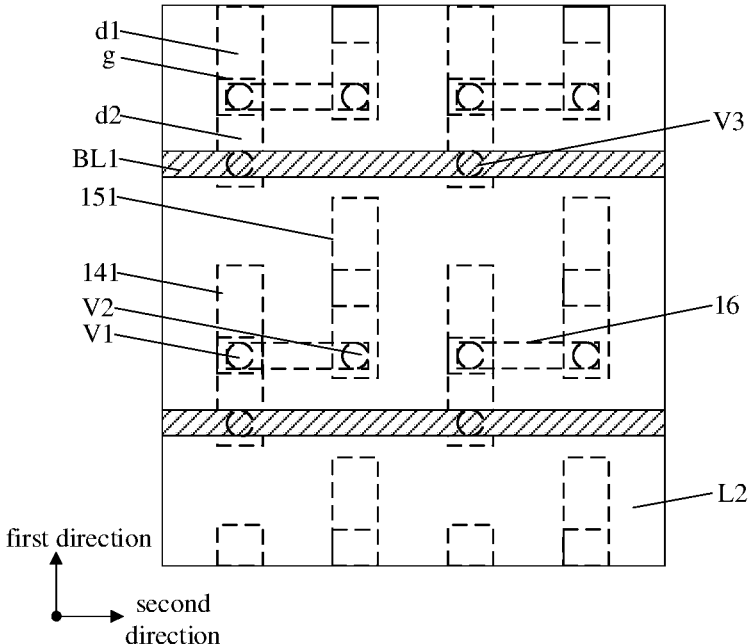
FIG. 10A is a fifteenth process flow diagram of a semiconductor structure provided by an embodiment of the disclosure.
Figure 10B:
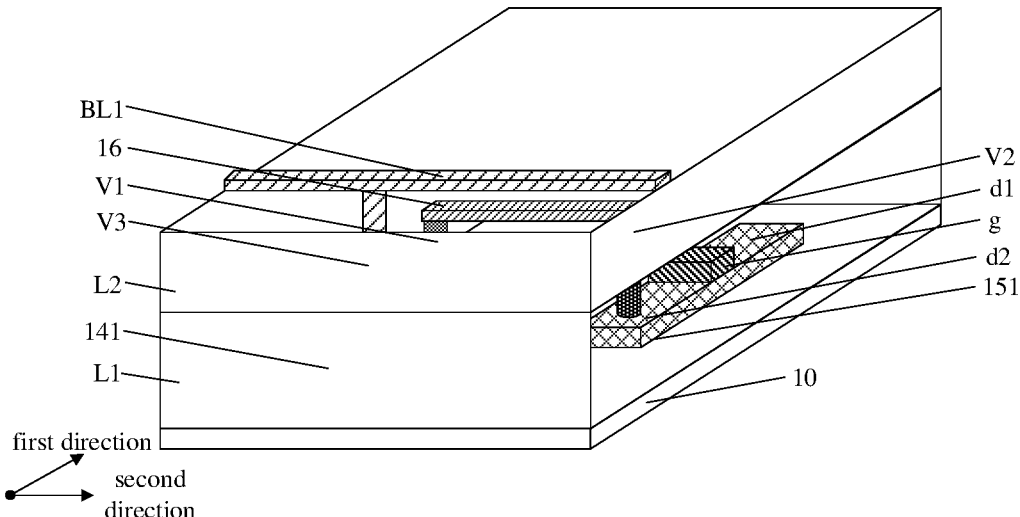
FIG. 10B is a sixteenth process flow diagram of a semiconductor structure provided by an embodiment of the disclosure.
Figure 11A:
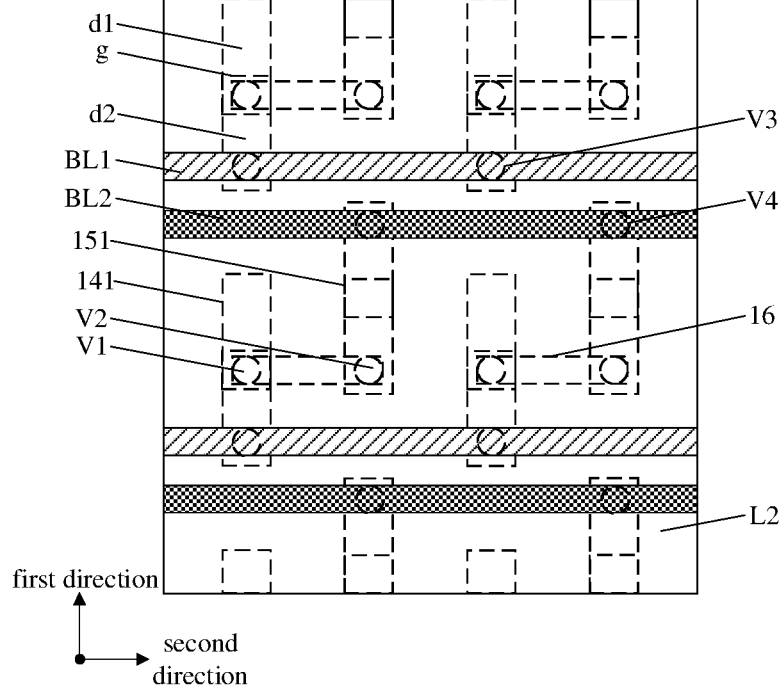
FIG. 11A is a seventeenth process flow diagram of a semiconductor structure provided by an embodiment of the disclosure.
Figure 11B:
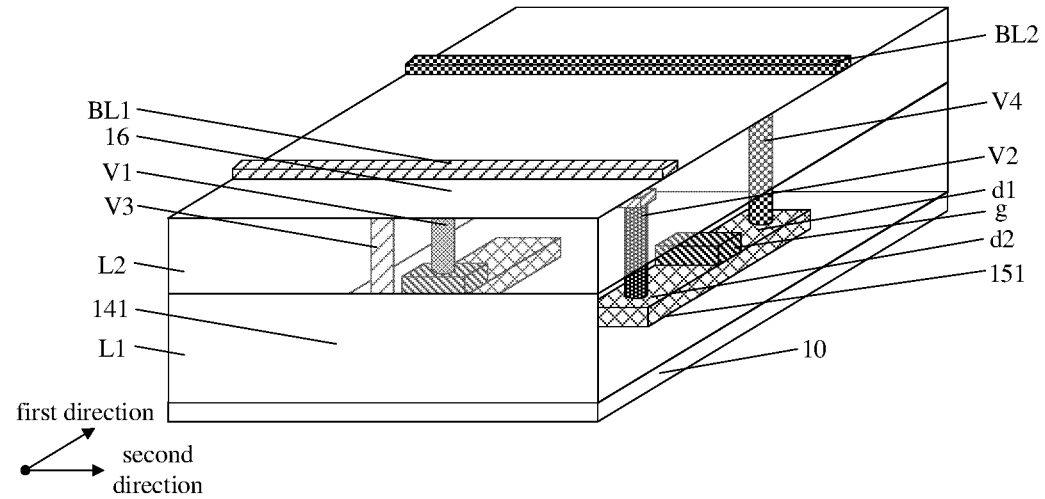
FIG. 11B is an eighteenth process flow diagram of a semiconductor structure provided by an embodiment of the disclosure.
Figure 12A:
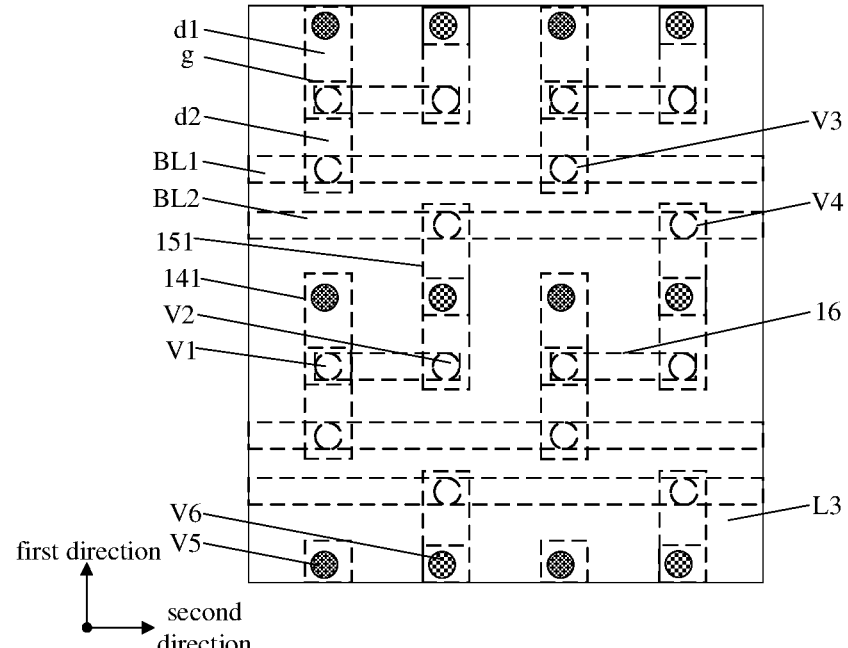
FIG. 12A is a nineteenth process flow diagram of a semiconductor structure provided by an embodiment of the disclosure.
Figure 12B:
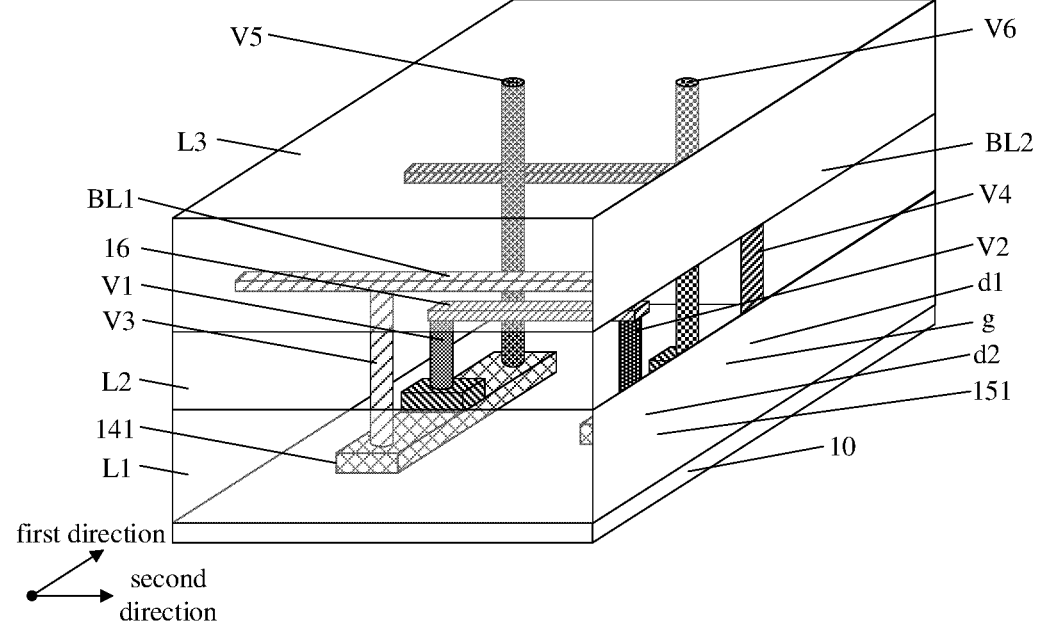
FIG. 12B is a twentieth process flow diagram of a semiconductor structure provided by an embodiment of the disclosure.

Next, as shown in FIGS. 7A to 7B, after forming the first active areas AA1 and the second active areas AA2, the method further includes the following operations.

The first active areas AA1 and the second active areas AA2 are doped to form a first channel c1 and a first electrode d1 and a second electrode d2 located on either side of the first channel c1 in each of the first active areas AA1, and to form a second channel c2 AA2 and a first electrode d1 and a second electrode d2 located on either side of the second channel c2 in each of the second active areas. A direction from the first electrode d1 of the first active area AA1 to the second electrode d2 of the first active area AA1 is the same as a direction from the first electrode d1 of the second active area AA2 to the second electrode d2 of the second active area AA2.

Gates g covering the first channel c1 and the second channel c2 are formed.

A doping type of the first electrode d1 and a doping type of the second electrode d2 may be same. The doping type of the first electrode d1 and the second electrode d2 may be different from a doping type of the first channel c1 or the second channel c2. For example, the first electrode d1 and the second electrode d2 are of P-type doping, and the first channel c1 or the second channel c2 is of N-type doping. Alternatively, the first electrode d1 and the second electrode d2 are of N-type doping, and the first channel c1 or the second channel c2 is of P-type doping.

The first active area AA1 and the gate g covering the first channel c1 constitute a first transistor 141, and the second active area AA2 and the gate g covering the second channel c2 constitute a second transistor 151. In embodiments of the disclosure, an oxide semiconductor material is used as the material of the substrate 11. Since the oxide semiconductor material has a higher carrier mobility and a lower leakage current, the leakage current of the first transistor 141 and the second transistor 151 can be effectively reduced, and an on-off current ratio and a current drivability of the first transistor 141 and the second transistor 151 can be effectively improved. Thus, an access speed of the semiconductor structure is increased, and thereby the power consumption is reduced.

In some embodiments, the first transistors 141 include read transistors, and the second transistors 151 include write transistors. One first transistor 141 and one second transistor 151 corresponding thereto constitute a memory cell. In embodiments of the disclosure, the length directions of the first transistor 141 and the second transistor 151 are the same, so that the first transistor 141 and the second transistor 151 can be arranged more closely, and thus the integration of the semiconductor structure is improved. In addition, there is no need to manufacture a capacitor additionally, so the process is simple. Moreover, no rewriting operation is needed after reading, thereby reducing power consumption.

In some embodiments, the length directions of the first transistor 141 and the second transistor 151 are the first direction. In this way, a maximum transistor arrangement density is allowed to be obtained compared to other length directions. But not limited thereto, in other embodiments, the length directions of the first transistor 141 and the second transistor 151 may also be oblique to the first direction.

The plurality of first transistors 141 arranged in the first direction form a first transistor column 14. The plurality of second transistors 151 arranged in the first direction form a second transistor column 15. In an embodiment, the first transistor column 14 and the second transistor column 15 are alternately arranged in a second direction perpendicular to the first direction. In the second direction, the projection of the first transistor 141 overlaps with the projection of the second transistor 151. But not limited thereto, the second direction may also be oblique to the first direction. The first transistor 141 and the second transistor 151 overlap in the second direction, so that the arrangement density of the transistors can be further increased. In a specific embodiment, in the second direction, the projection of a first electrode d1 of the first transistor 141 overlaps with the projection of the gate g of the second transistor 151, and the projection of the gate g of the first transistor 141 overlaps with the projection of the second electrode d2 of the second transistor 151, thereby allowing for a maximum arrangement density compared to other arrangements. In a more specific embodiment, in the second direction, there is at least a region where the projection of the second electrode d2 of the first transistor 141 does not overlap with the projection of the first electrode d1 of the second transistor 151.

As shown in FIG. 7A, in some embodiments, the number of the first transistor column 14 and the number of the second transistor column 15 are both plural. The plurality of first transistor columns 14 and the plurality of second transistor columns 15 are alternately arranged in the second direction.

In some embodiments, the method further includes: before forming the gates g covering the first channel c1 and the second channel c2, forming gate dielectric layers (not shown) covering the first channel c1 and the second channel c2. The gate dielectric layers (not shown) is located below the gates g. A material of the gates g includes one or more of tungsten (W), copper (Cu), titanium (Ti), tantalum (Ta), titanium nitride (TiN), tantalum nitride (TaN), a metal silicide, or a metal alloy. A material of the gate dielectric layers (not shown) may be a material with a high dielectric constant, such as tantalum oxide, hafnium oxide, zirconium oxide, niobium oxide, titanium oxide, barium oxide, strontium oxide, yttrium oxide, lanthanum oxide, praseodymium oxide, strontium barium titanate, etc.

Next, as shown in FIGS. 8A to 9B, after forming the first transistor columns 14 and the second transistor columns 15 on the substrate 11, the method further includes the following operations.

A first filling layer L1 is formed. The first filling layer L1 fills gaps between the first transistors 141 and the second transistors 151, and covers the first transistors 141 and the second transistors 151. At least one first contact plug V1 and at least one second contact plug V2 penetrating the first filling layer L1 are formed. A bottom of the first contact plug V1 is electrically connected to the gate g of the first transistor 141, and a bottom of the second contact plug V2 is electrically connected to the second electrode d2 of the second transistor 151.

At least one interconnect line 16 is formed. Either ends of each interconnect line 16 are electrically connected to a top of the first contact plug V1 and a top of the second contact plug V2 adjacent thereto, respectively.

Next, as shown in FIGS. 10A to 11B, after forming the interconnect line 16, the method further includes the following operations.

A second filling layer L2 is formed. The second filling layer L2 covers the first filling layer L1 and the interconnect line 16. A third contact plug V3 penetrating the second filling layer L2 and the first filling layer L1 is formed. A bottom of the third contact plug V3 is electrically connected to the second electrode of the first transistor 141. A first bit line BL1 extending in the second direction is formed on the second filling layer L2. The first bit line BL1 is electrically connected to a top of the third contact plug V3.

A fourth contact plug V4 penetrating the second filling layer L2 and the first filling layer L1 is formed. A bottom of the fourth contact plug V4 is electrically connected to the first electrode d1 of the second transistor 151. A second bit line BL2 extending in the second direction is formed on the second filling layer L2. The second bit line BL2 is electrically connected to a top of the fourth contact plug V4.

The third contact plug V3 and the first bit line BL1 are formed, and then the fourth contact plug V4 and the second bit line BL2 are formed. But not limited thereto, in other embodiments, multiple through holes penetrating the second filling layer L2 and the first filling layer L1 may be formed simultaneously. Then, a third contact plug V3 and a fourth contact plug V4 are formed simultaneously in the multiple through holes. Then, a conductive material is deposited on the second filling layer L2. Then, the conductive material is etched to form the first bit line BL1 and the second bit line BL2 simultaneously. Therefore, the third contact plug V3 and the fourth contact plug V4 are formed in a same process operation, and the first bit line BL1 and the second bit line BL2 are formed in a same process operation, thus simplifying the process.

In some embodiments, the number of the first bit line BL1 and the number of the second bit line BL2 are both plural. The plurality of first bit lines BL1 and the plurality of second bit lines BL2 are alternately arranged in the first direction.

Next, as shown in FIGS. 12A to 12B and FIGS. 1A to 1B, after forming the first bit line BL1 and the second bit line BL2, the method further includes the following operations.

A third filling layer L3 is formed. The third filling layer L3 covers the second filling layer L2, the first bit line BL1 and the second bit line BL2. A fifth contact plug V5 and a sixth contact plug V6 penetrating the third fill layer L3, the second fill layer L2, and the first fill layer L1 are formed. A bottom of the fifth contact plug V5 is electrically connected to the first electrode d1 of the first transistor 141. A bottom of the sixth contact plug V6 is electrically connected to the gate g of the second transistor 151.

A first word line WL1 and a second word line WL2 extending in the first direction are formed on the third filling layer L3. The first word line WL1 is electrically connected to a top of the fifth contact plug V5, and the second word line WL6 is electrically connected to a top of the sixth contact plug V6.

A method for forming the first word line WL1 and the second word line WL2 may include the following operations. A conductive material is formed on the third filling layer L3. Then, by a self-aligned double patterning process (SADP) or a self-aligned quadruple patterning process (SAQP), the conductive material is etched to form the first word line WL1 and the second word line WL2 simultaneously, thus simplifying the process. In an embodiment, the number of the first word line WL1 and the number of the second word line WL2 are both plural. The plurality of first word lines WL1 and the plurality of second word lines WL2 are alternately arranged in the second direction. In some embodiments, the plurality of first word lines WL1 and the plurality of second word lines WL2 are arranged at equal intervals in the second direction.

The first bit lines BL1 and the second bit lines BL2 constitute the plurality of bit lines BL. The first word lines WL1 and the second word lines WL2 constitute the plurality of word lines WL. In embodiments of the disclosure, by setting that a direction from the first electrode d1 to the second electrode d2 of the first active area AA1 is the same as a direction from the first electrode d1 to the second electrode d2 of the second active area AA2, that is, a direction from a source to a drain of the first transistor 141 is the same as a direction from a source to a drain of the second transistor 151, distances between the word lines WL, the bit lines BL, the third contact plug V3 and the fourth contact plug V4 may be widened to obtain a better arrangement, thereby better avoiding problems such as short circuit caused by mutual contact of the word lines WL, the bit lines BL, the third contact plug V3 and the fourth contact plug V4.

In embodiments of the disclosure, the word lines WL are arranged above the bit lines BL, the bit lines BL are arranged to extend in the second direction, and the word lines WL are arranged to extend in the first direction, instead of arranging the bit lines BL above the word lines WL or the bit lines BL to extend in the first direction and the word lines WL to extend in the second direction. Therefore, the word lines WL, the bit lines BL can be better prevented from mutual contacting with the third contact plug V3, the fourth contact plug V4, and a larger arrangement space can be obtained for the word lines WL and the bit lines BL.

It is to be understood that there is at least a region where the projection of the second electrode d2 of the first transistor 141 in the second direction does not overlap with the projection of the first electrode d1 of the second transistor 151 in the second direction. Therefore, the bit lines BL, the third contact plug V3 and the fourth contact plug V4 can be better prevented from contacting each other.

In the embodiments of the disclosure, by arranging the first word line WL1 and the second word line WL2 above the interconnect line 16, a problem of short circuit caused by mutual contacting of the word lines WL with the first contact plug V1, the second contact plug V2 is avoided.

Materials of the word lines WL, the bit lines BL, the interconnect line 16, the first contact plug V1, the second contact plug V2, the third contact plug V3, the fourth contact plug V4, the fifth contact plug V5, and the sixth contact plug V6 include one or more of tungsten (W), copper (Cu), titanium (Ti), tantalum (Ta), titanium nitride (TiN), tantalum nitride (TaN), a metal silicide, or a metal alloy. Materials of the first fill layer L1, the second fill layer L2, and the third fill layer L3 include one or more of an oxide (such as silicon oxide), a nitride (such as silicon nitride), or oxynitride (such as silicon oxynitride).

It is to be noted that those skilled in the art can change the above step sequences without departing from the protection scope of the disclosure. The above is only the preferred embodiments of the disclosure, and is not intended to limit the protection scope of the disclosure. Any modification, equivalent replacement and improvement made within the spirit and principles of the disclosure shall be included in the protection scope of the disclosure.

What is claimed is:

1. A semiconductor structure, comprising:
a substrate;
first transistor columns and second transistor columns on the substrate, wherein the first transistor columns and the second transistor columns are alternately arranged, wherein a first transistor column comprises a plurality of first transistors arranged in a first direction, a second transistor column comprises a plurality of second transistors arranged in the first direction, and the plurality of first transistors in the first transistor column are electrically connected to the plurality of second transistors in the second transistor column in one-to-one correspondence;

15

16 wherein a length direction of a first transistor is same as a length direction of a second transistor, and a center of the first transistor is offset from a center of the second transistor in the first direction;

wherein the length direction of the first transistor and the length of the second transistor both are the first direction, the first transistor columns and the second transistor columns are alternately arranged in a second direction;

wherein the first direction and the second direction are paralleled to a top surface of the substrate, the first direction and the second direction are intersected; and wherein the first transistor comprises a gate, and a first electrode and a second electrode on either side of the gate, the second transistor comprises a gate, and a first electrode and a second electrode on either side of the gate, wherein the first electrode and the second electrode each is one of a source or a drain, and the first electrode and the second electrode are different, wherein a direction from the first electrode to the second electrode of the first transistor is same as a direction from the first electrode to the second electrode of the second transistor;

at least one interconnect line located above the substrate, wherein each interconnect line electrically connects the gate of the first transistor with the second electrode of the second transistor.

2. The semiconductor structure of claim 1, wherein the second direction is perpendicular to the first direction; and a projection of the first transistor overlaps with a projection of the second transistor in the second direction.

3. The semiconductor structure of claim 1, further comprising:

a plurality of bit lines located above the substrate and extending in a second direction, wherein a bit line is connected to the second electrode of the first transistor or the first electrode of the second transistor; and a plurality of word lines located above the bit lines and extending in the first direction, wherein a word line is connected to the first electrode of the first transistor or the gate of the second transistor.

4. The semiconductor structure of claim 3, wherein the word lines are located above the interconnect line.

5. The semiconductor structure of claim 3, wherein the plurality of word lines comprise first word lines and second word lines alternately arranged in the second direction, wherein the first word line is electrically connected to the first electrode of the first transistor, and the second word line is electrically connected to the gate of the second transistor; and the plurality of bit lines comprise first bit lines and second bit lines alternately arranged in the first direction, wherein the first bit line is electrically connected to the second electrode of the first transistor, and the second bit line is electrically connected to the first electrode of the second transistor.

6. The semiconductor structure according to claim 4, wherein the interconnect line is electrically connected to the gate of first transistor through a first contact plug, and the interconnect line is electrically connected to the second electrode of the second transistor through a second contact plug.

7. The semiconductor structure of claim 5, wherein the first bit line is electrically connected to the second electrode of the first transistor through a third contact plug, the second bit line is electrically connected to the first electrode of the second transistor through a fourth contact plug, the first word line is electrically connected to the first electrode of the first transistor through a fifth contact plug, and the second word line is electrically connected to the gate of the second transistor through a sixth contact plug.

8. The semiconductor structure of claim 1, wherein the first transistors comprise read transistors and the second transistors comprise write transistors.

9. The semiconductor structure of claim 1, wherein a material of the substrate comprises $In_XGa_YZn_ZO$, where x, y, and z are positive integers greater than or equal to 1.

10. A manufacturing method of a semiconductor structure, comprising:

providing a substrate; and forming first transistor columns and second transistor columns on the substrate, wherein the first transistor columns and the second transistor columns are alternately arranged, a first transistor column comprises a plurality of first transistors arranged in a first direction, a second transistor column comprises a plurality of second transistors arranged in the first direction, the plurality of first transistors in the first transistor column are electrically connected to the plurality of second transistors in the second transistor column in one-to-one correspondence; wherein a length direction of a first transistor is same as a length direction of a second transistor, and a center of the first transistor is offset from a center of the second transistor in the first direction;

wherein forming the first transistor columns and the second transistor columns on the substrate comprises:

etching the substrate to form first wall-like structures extending in the first direction and second wall-like structures extending in the first direction, wherein the first wall-like structures and the second wall-like structures are alternately arranged in a second direction;

etching the first wall-like structures to form a plurality of first openings in a first wall-like structure, wherein the plurality of first openings disconnect the first wall-like structure into a plurality of first active areas; and etching the second wall-like structures to form a plurality of second openings in a second wall-like structure, wherein the plurality of second openings disconnect the second wall-like structure into a plurality of second active areas, a center of a second opening is offset from a center of a first opening in the first direction, and a center of a first active area is offset from a center of a second active area in the first direction;

wherein the first direction and the second direction are paralleled to a top surface of the substrate, the first direction and the second direction are intersected;

further comprising: after forming the first active areas and the second active areas, doping the first active areas and the second active areas to form a first channel, and a first electrode and a second electrode on either side of the first channel in each of the first active areas, and to form a second channel, and a first electrode and a second electrode on either side of the second channel in each of the second active areas, wherein a direction from the first electrode of the first active area to the second electrode of the first active area is same as a direction from the first electrode of the second active area to the second electrode of the second active area; and forming gates covering the first channel and the second channel;

further comprising: after forming first transistor columns and second transistor columns on the substrate, forming a first filling layer, which fills gaps between the first transistors and the second transistors and covers the first transistors and the second transistors;

forming at least one first contact plug and at least one second contact plug penetrating through the first filling layer, wherein a bottom of the first contact plug is electrically connected to a gate of the first transistor, and a bottom of the second contact plug is electrically connected to a second electrode of the second transistor; and forming at least one interconnect line, wherein either ends of each interconnect line are electrically connected to a top of the first contact plug and a top of the second contact plug adjacent to the first contact plug, respectively.

11. The manufacturing method of claim 10, further comprising: after forming the interconnect lines, forming a second filling layer, which covers the first filling layer and the interconnect line;

forming a third contact plug penetrating through the second filling layer and the first filling layer, wherein a bottom of the third contact plug is electrically connected to a second electrode of the first transistor; and forming a first bit line extending in the second direction on the second filling layer, wherein the first bit line is electrically connected to a top of the third contact plug; and forming a fourth contact plug penetrating through the second filling layer and the first filling layer, wherein a bottom of the fourth contact plug is electrically connected to a first electrode of the second transistor; and forming a second bit line extending in the second direction on the second filling layer, wherein the second bit line is electrically connected to a top of the fourth contact plug.

12. The manufacturing method of claim 11, further comprising: after forming the first bit line and the second bit line, forming a third filling layer, which covers the second filling layer, the first bit line and the second bit line;

forming a fifth contact plug and a sixth contact plug penetrating through the third filling layer, the second filling layer, and the first filling layer, wherein a bottom of the fifth contact plug is electrically connected to a first electrode of the first transistor, and a bottom of the sixth contact plug is electrically connected to a gate of the second transistor; and forming a first word line and a second word line extending in the first direction on the third filling layer, wherein the first word line is electrically connected to a top of the fifth contact plug, and the second word line is electrically connected to a top of the sixth contact plug.

13. The manufacturing method of claim 10, wherein a material of the substrate comprises $In_xGa_yZn_zO$, where x, y, and z are positive integers greater than or equal to 1.

* * * * *